United States Patent
Gaun et al.

(10) Patent No.: US 7,579,631 B2
(45) Date of Patent: Aug. 25, 2009

(54) VARIABLE BREAKDOWN CHARACTERISTIC DIODE

(75) Inventors: David Gaun, Brookline, MA (US);
Colin S. Bill, Cupertino, CA (US);
Swaroop Kaza, Woburn, MA (US)

(73) Assignee: Spansion LLC, Sunnyvale, CA (US)

( * ) Notice: Subject to any disclaimer, the term of this patent is extended or adjusted under 35 U.S.C. 154(b) by 521 days.

(21) Appl. No.: 11/087,000

(22) Filed: Mar. 22, 2005

(65) Prior Publication Data
US 2006/0214183 A1 Sep. 28, 2006

(51) Int. Cl.
*H01L 29/00* (2006.01)

(52) U.S. Cl. .................... 257/106; 257/40; 257/200; 257/E29.17

(58) Field of Classification Search .............. 257/106, 257/200, 40, 2, 3, 4, 5, 910, E29.17, E29.33, 257/E21.613, E21.645; 365/110
See application file for complete search history.

(56) References Cited

U.S. PATENT DOCUMENTS

| | | | |
|---|---|---|---|
| 5,818,749 A * | 10/1998 | Harshfield | 365/105 |
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B2 | 7/2004 | Krieger et al. | |
| 6,770,905 B1 | 8/2004 | Buynoski et al. | |
| 6,773,954 B1 | 8/2004 | Subramanian et al. | |
| 6,781,868 B2 | 8/2004 | Bulovic et al. | |
| 6,787,458 B1 | 9/2004 | Tripsas et al. | |
| 6,803,267 B1 | 10/2004 | Subramanian et al. | |
| 6,825,060 B1 | 11/2004 | Lyons et al. | |
| 6,847,047 B2 * | 1/2005 | VanBuskirk et al. | 257/40 |
| 6,852,586 B1 | 2/2005 | Buynoski et al. | |
| 6,858,481 B2 | 2/2005 | Krieger et al. | |
| 6,864,522 B2 | 3/2005 | Krieger et al. | |
| 2004/0026714 A1 * | 2/2004 | Krieger et al. | 257/200 |

OTHER PUBLICATIONS

Web text book document by Van Zeghbroeck Chater 4 published by University of Colorado year 2004 about Diode breakdown voltage.*

* cited by examiner

*Primary Examiner*—Thinh T Nguyen
(74) *Attorney, Agent, or Firm*—Turocy & Watson, LLP

(57) ABSTRACT

A memory cell made of at least two electrodes with a controllably conductive media between the at least two electrodes is disclosed. The controllably conductive media includes a passive layer made of super ionic material and an active layer. When an external stimuli, such as an applied electric field, is imposed upon the first and second electrode, ions move and dope and/or de-dope the polymer. The applied external stimuli used to dope the polymer is larger than an applied external stimuli to operate the memory cell. The polymer functions as a variable breakdown characteristic diode with electrical characteristics which are a consequence of the doping degree. The memory element may have a current limited read signal. Methods of making the memory devices/cells, methods of using the memory devices/cells, and devices such as computers, hand-held electronic devices and memory devices containing the memory cell(s) are also disclosed.

23 Claims, 11 Drawing Sheets

VARIABLE BREAKDOWN CHARACTERISTIC DIODE

TECHNICAL FIELD

The invention generally relates to memory devices and methods of making and using the memory devices. In particular, the invention relates to memory devices having variable breakdown characteristic diode(s).

BACKGROUND ART

Computer and memory devices perform various functions including information processing and storage. Typically, in computer systems, the arithmetic, logic, and memory operations are performed by devices capable of reversibly switching between two states, often referred to as "0" and "1." These switching devices are fabricated from semiconductor devices that perform these various functions and which are capable of switching between two states at a high speed.

For storage or processing of data, electronic addressing or logic devices may be made with inorganic solid state technology, and particularly crystalline silicon devices. The main device for performing these functions is the metal oxide semiconductor field effect transistor (MOSFET).

There is an increasing demand for making computers and memory devices faster, smaller and inexpensive. To meet these demands requires integration and fitting an ever increasing amount of transistors and other electronic structures onto pieces of silicon that are smaller than a postage stamp. This miniscule piece of silicon may contain tens of millions of transistors, were each transistor is as small as a few hundred nanometers. However, these silicon-based devices are fast approaching their fundamental physical size-limits.

Inorganic solid-state devices are generally encumbered with a complex architecture leading to high cost and a loss of data storage density. The circuitry of volatile semiconductor memories manufactured with inorganic semiconductor material must be constantly supplied with electric current, resulting in heating and high electric power consumption to maintain the stored information. Non-volatile semiconductor devices have a reduced data rate and relatively high power consumption as well as a high degree of complexity.

In addition, as the size of inorganic solid-state devices decreases and integration increases, the fabrication process is rendered more difficult because of the increase in the sensitivity to alignment tolerances of the device. Formation of features at small minimum sizes does not imply that the minimum size can be used for fabrication of working circuits. It is necessary to have alignment tolerances which are much smaller than the small minimum size, for example, one quarter the minimum size.

Generally, the control of a semiconductor device is accomplished through the utilization of electricity. A voltage is placed across the device to put it in a predetermined state, thus "controlling" it. Depending on the device being subjected to the voltage, it may store a value represented by the state or it may turn the device ON or OFF. If the device is a memory cell, it may be programmed to read, write or erase based on the voltage level and polarity. If the device is an LED, application of the voltage may turn the emitter ON or OFF, reduce its brightness or increase its brightness. Thus, it is imperative for proper operation of these types of devices that there is a means to control the application and level of the voltages across the devices. Current manufacturing techniques utilize additional external semiconductor devices for this purpose, such as transistors. These transistors are somewhat complex devices that require a multitude of fabrication steps to produce.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The invention provides new memory devices that possess one or more of the following: small size compared to conventional memory devices, capability to store multiple bits of information, short resistance/impedance switch time, low operating voltages, low cost, high reliability, long life (thousands/millions of cycles), capable of three dimensional packing, associated low temperature (or high temperature) processing, light weight, high density/integration, and extended memory retention.

One aspect of the invention relates to a memory device containing a first electrode and at least a second electrode. There is a controllably conductive media between the first electrode and the at least second electrode. The controllably conductive media includes a passive layer and an active layer. The passive layer can include super ionic material. An external stimuli, greater than the external stimuli required to operate the device, is applied between the first and at least second electrode causing ions in the media to move. The movement of the ions causes a change in the media, known as doping. The doped media functions as a variable breakdown characteristic diode with a variable doping degree.

According to yet another aspect of the invention is a method of forming a memory cell including providing a first electrode, a second electrode and a polymer film therebetween, the polymer film having a controllably conductive media. The controllably conductive media further includes a passive layer and an active layer. Applying a voltage between the first and second electrodes, causing the ions to move in the polymer film, wherein the applied voltage level controls the doping degree of the polymer film. The doped polymer functions as a variable breakdown characteristic diode.

According to still another aspect of the invention is a memory cell having first and second electrodes with a controllably conductive media therebetween. The controllably conductive media having a passive layer that includes superionic material and an active layer that includes conductive material. Voltage is applied to the electrodes causing doping of the active layer, wherein the media operates as a variable breakdown characteristic diode or Zener diode, for example. The memory cell having the doped active layer may be utilized in, for example, a computer, a hand-held electronic device, or a memory device including an array of the memory cells.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

Figure 1:
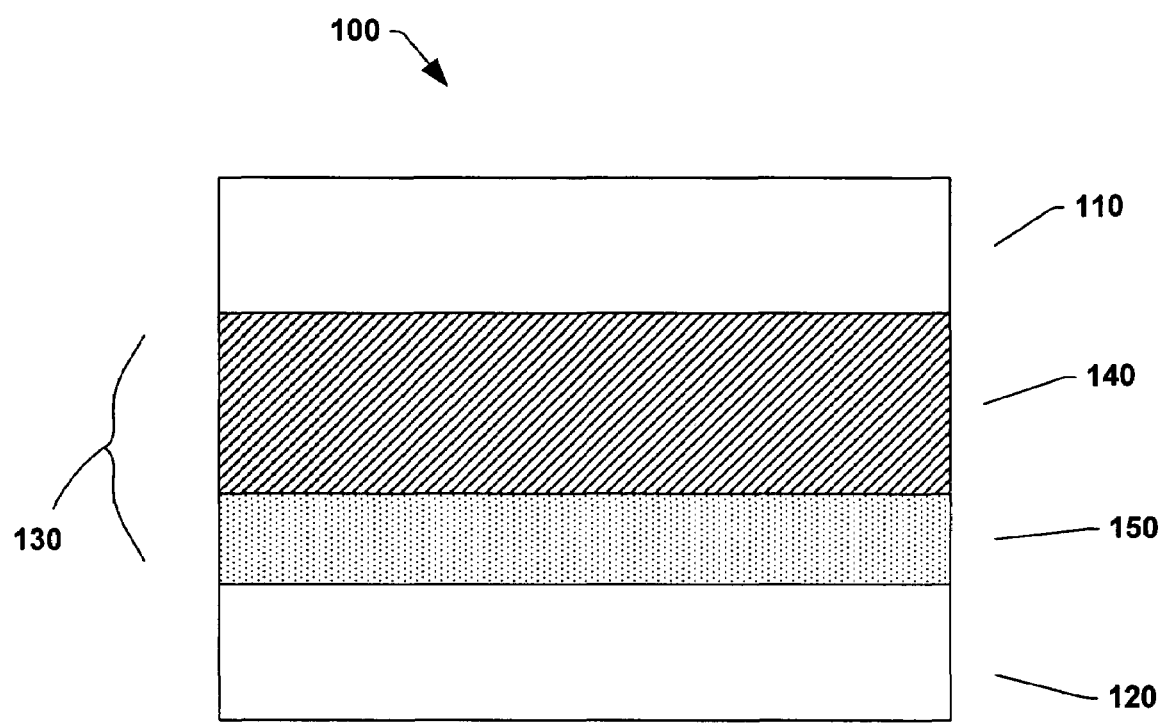
FIG. 1 illustrates a memory cell in accordance with an aspect of the invention.

The invention is now described with reference to the drawings, wherein like reference numerals are used to refer to like elements throughout. In the following description, for purposes of explanation, numerous specific details are set forth in order to provide a thorough understanding of the invention. It may be evident, however, that the invention may be practiced without these specific details. In other instances, well-known structures and devices are shown in block diagram form in order to facilitate describing the invention.

The invention involves memory cells made of at least two electrodes with a controllably conductive media between the two electrodes. The controllably conductive media contains a low conductive (active) layer and a passive layer. The media may be organic, inorganic, or organic mixed with inorganic material(s). The memory cells may optionally contain additional layers, such as additional electrodes, charge retention layers, and/or chemically active layers. The impedance of the controllably conductive media changes when an external stimuli such as an electric field is applied. A plurality of the memory cells, which may be referred to as an array, form, with other components, a memory device. In this connection, memory cells may form new memory devices and function in a manner analogous to metal oxide semiconductor field effect transistors (MOSFETs) in conventional semiconductor memory devices.

The invention provides a semiconductor device that allows control of its memory cell via a diodic layer. This is accomplished by forming the device and doping and de-doping a polymer film of the device, resulting in a diodic layer with a controllable back and forth motion of ions to provide memory characteristics. The diodic layer functions electrically as a diode to control the amount of current flowing through the cell when a voltage is applied across the memory cell. This layer may have characteristics similar to a Zener-type diode, for example. In a Zener diode, a breakdown voltage level can be inherently predetermined by the composition of the diode. This breakdown voltage value is chosen to allow a specific operational function to result in the device. This function may include such things as reading, writing or erasing a semiconductor cell such as a memory cell.

With reference to FIG. 1, illustrated is a memory cell 100 in accordance with an aspect of the invention. The memory cell 100 has a first electrode or active layer electrode 110 and a second electrode or passive layer electrode 120 with a controllably conductive media 130 therebetween. The controllably conductive media 110 contains a low conductive layer 140 and passive layer 150. Peripheral circuitry and devices are not shown for brevity.

The memory cell 100 contains at least two electrodes, as one or more electrodes may be disposed between the two electrodes that sandwich the controllably conductive media 130. Typically, the thickness of each electrode is independently about 0.01 µm or more and about 10 µm or less.

The electrodes 110, 120 are made of conductive material, such as conductive metal, conductive metal alloys, conductive metal oxides, conductive polymer films, semiconductor materials, and the like. Examples of electrodes include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes include Hastelloy®, Kovar®, Invar, Monel®, Inconel®, brass, stainless steel, magnesium-silver alloy, and various other alloys.

The controllably conductive media, disposed between the two electrodes, can be rendered conductive, semiconductive, or nonconductive in a controllable manner using an external stimuli. Generally, in the absence of an external stimuli, the controllably conductive media is nonconductive or has a high impedance. Further, in some embodiments, multiple degrees of conductivity/resistivity may be established for the controllably conductive media in a controllable manner. For example, the multiple degrees of conductivity/resistivity for the controllably conductive media may include a nonconductive state, a highly conductive state, and a semiconductive state. The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given nonconductive controllably conductive media is converted to a conductive controllably conductive media.

The controllably conductive media contains one or more low conductive layers and one or more passive layers. The low conductive layer can be formed from various materials including organic semiconductor materials, inorganic semiconductor materials and mixtures of organic and inorganic semiconductor materials. Typically, the low conductive or active layer has a thickness of about 0.001 µm or more and about 5 µm or less.

The organic semiconductor layer contains at least one of an organic polymer (such as a conjugated organic polymer), an organometallic compound (such as a conjugated organometallic compound), an organometallic polymer (such as a conjugated organometallic polymer), a buckyball, a carbon nanotube (such as a C6-C60 carbon nanotubes), and the like. The organic polymers (or the organic monomers constituting the organic polymers) may be cyclic or acyclic. During formation or deposition, the organic polymer self assembles between the electrodes. Examples of conjugated organic polymers include one or more of polyacetylene; polyphenylacetylene; polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole)diphenylacetylene; polydiacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polypyrrole; polystyrene; polyfuran; polyindole; polyazulene; polyphenylene; polypyridine; polybipyridine; polysexithiofene; poly(siliconoxohemiporphyrazine); poly(germaniumoxohemiporphyrazine); poly(ethylenedioxythiophene); polypyridine metal complexes; and the like.

Inorganic materials include transition metal sulfides, chalcogenides, and transition metal oxides. Examples include copper oxide ($CuO$, $Cu_2O$), iron oxide ($FeO$, $Fe_3O_4$), manganese oxide ($MnO_2$, $Mn_2O_3$, etc), titanium oxide ($TiO_2$).

The active low conductive layer can be a mixture of organic and inorganic materials. The inorganic material (transition metal oxide/sulfide) is usually embedded in an organic semiconductor material. Examples include polyphenylacetylene mixed with $Cu_2S$, polyphenylacetylene mixed with $Cu_2O$, and the like.

The passive layer, or super ionic layer, contains at least one conductivity facilitating compound that contributes to the controllably conductive properties of the controllably conductive media. The conductivity facilitating compound has the ability to donate and accept charges (holes and/or electrons). The passive layer thus may transport between an electrode and the low conductive layer/passive layer interface, facilitate charge/carrier injection into the low conductive layer, and/or increase the concentration of a charge carrier in the low conductive layer. In other words, the super ionic layer is a source of dopant ions that provide a controllable back and forth motion of ions, depending on the status of an applied external stimuli, to produce a memory characteristic. The dopant ions move from a passive layer (super ionic) to an active layer (conductive polymer/material) to dope the active layer and change its electrical properties. In addition, the dopant ions can move from the active layer (conductive polymer/material) back to the passive layer (super ionic) thereby de-doping and restoring the active layer to its original electrical properties. The nature or electrical properties of the super ionic layer is unaffected by the movement of dopant ions. Examples of conductivity facilitating compounds that may make up the passive layer include one or more of copper sulfide ($Cu_xS$, where x is from about 0.5 to about 5), silver sulfide ($Ag_2S$, $AgS$), gold sulfide ($Au_2S$, $AuS$), and the like. Other examples for the passive/super ionic layer $CuS$, $CuO$, $Cu_2O$, $Cu_2Se$, $Ag_2Se$, $TiSe_2$, and the like. The super ionic material facilitates the supply and acceptance of ions. Typically, the passive layer containing the conductivity facilitating compound has a thickness of 2 Å or more and about 0.1 μm or less.

Figure 2:
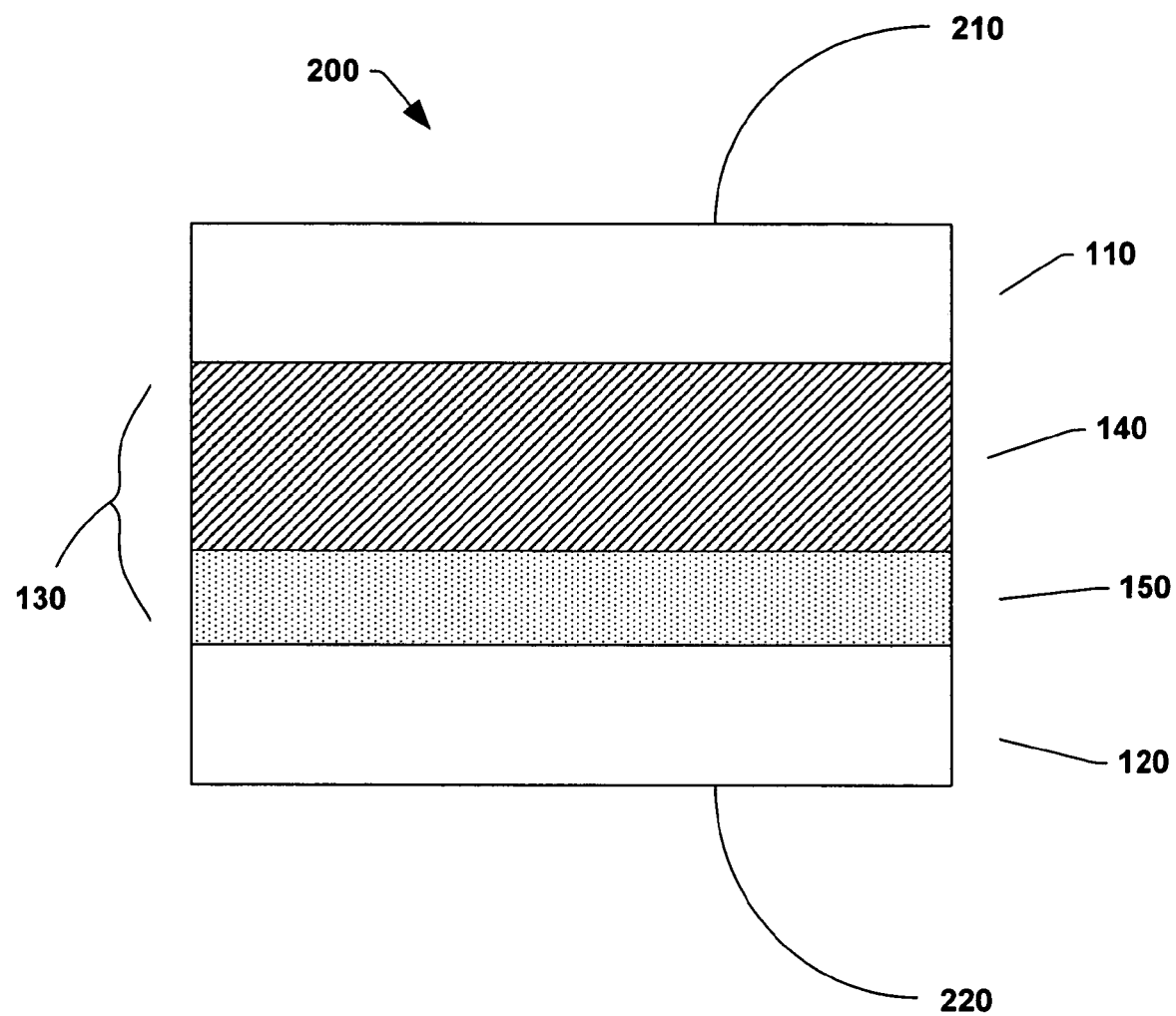
FIG. 2 illustrates a memory cell with a external stimuli applied.

Referring now to FIG. 2, illustrated is a memory cell 200 with a first electrode 110 and a second electrode 120. Disposed between the first electrode 110 and the second electrode 120 is a controllably conductive media 130 including a low conductive layer 140 and a passive layer 150. In order for the controllably conductive media to function as a variable breakdown characteristic diode, the electrical properties of the media must be altered. This altering of the electrical properties is commonly referred to as doping, and consists of introducing an element, known as a dopant for purposes of altering electrical properties. The altering of the electrical properties according to the invention is also a result of de-doping, removing or reducing the amount of dopant that was introduced in the element.

Doping of the memory cell 200 occurs when an external stimuli, such as an electrical signal, is applied to the first electrode 110 and the second electrode 120. The external stimuli may be provided via any of various known methods and such as via external contact wires 210, 220.

The external stimuli applied with a first polarity across a first electrode 110 and a second electrode 120 causes ions to move from the passive layer, or super ionic layer 150 to the low-conductive (active) layer 140, resulting in programming. The external stimuli applied via the first electrode 110 and second electrode 120 to dope the media 130 is a larger stimuli than that used to operate the memory cell. As the ions move and dope the active layer 140 the electrical properties of the active layer 140 change and the device exhibits the working characteristics of a Zener diode, for example. The electrical characteristics of such a device depends on the doping degree. An external stimuli of a second or opposite polarity is applied to de-dope or remove the dopant from the active layer 140. Thereby changing the electrical properties of the active layer 140, resulting in erasing the memory cell. It should be noted that the electrical properties of the passive or superionic layer do not change during operation of the device.

The external stimuli applied is dependent upon the chosen material/materials-interface of the memory cell. Each material/material-interface has a working voltage range recommended by its electrical properties. The external stimuli operates to change the reverse breakdown voltage of the memory cell.

The polarity of the external stimuli with regard to the first and at least second electrode is dependant upon the polarity of the dopant ions within the passive layer 150. Positive dopant ions, such as Cu+, Li+, Na+, etc, require the application of positive bias to the passive layer 150 with respect to the active layer. In this way the applied stimuli acts to push, force or cause movement of the positively charged ions into the active layer 140. Negatively charged dopant ions, such as I– (iodine), would act in exactly the opposite way. The application of positive bias to the active layer 140 with respect to the passive layer 150 via an external stimuli would cause the ions to move into the active layer 140.

In some situations, the ions move from the passive or super ionic layer 150 to the active layer 140 and in other situations, the ions move from the active layer 140 toward the passive or super ionic layer 150. The super ionic layer 150 is the primary source of dopant ions and the controllable back and forth motion of the ions provide the memory characteristic of the memory cell 200. For example, when ions move from the passive layer (super ionic) to the active layer (conductive polymer/material), the ions dope and change the electronic properties (e.g. the diode reverse breakdown voltage) of the active layer 140. This change results in a programming state of the memory cell. Moving the ions back to the passive layer via de-doping or removing the ions from the active layer, restores the original electronic properties of the active layer 140, thereby erasing the memory. Thus, there are at least two states, corresponding to at least two different reverse breakdown voltages, providing the ability to switch between the states, i.e. programming and erasing, by moving ions across the passive layer/active layer interface, resulting in memory.

To fully appreciate the invention, it is helpful to understand the basics of how diodes operate. A diode is essentially a two-region device separated by a junction. It either allows current to pass or prohibits current to pass. Whether the current is allowed to pass, is determined by the voltage level and polarity, referred to as biasing. Generally, when the polarity of the applied voltage matches the polarity of the diode region at the junction, the diode is considered to be forward biased, permitting the current to flow. When the polarities are opposing, the diode is considered to be reverse biased, inhibiting the current flow. Current flow in a reverse biased diode can be achieved by raising the applied voltage to a level that forces the junction into breakdown. Generally, reaching this condition in a normal diode will damage it due to the generation of heat caused by the increased current. For Zener-type diodes, however, breakdown is not a damaging condition and the current flow will once again stop when the applied voltage level is reduced below the level required to cause breakdown.

In general, the relationship between the current and voltage can be expressed using the ideal diode equation:

$$I_D = I_S \left( e^{\frac{qV_D}{nKT}} - 1 \right)$$

where $I_D$ is the current through the diode and $V_D$ is the voltage across the diode. Additionally, $I_S$ is the reverse saturation current (the current that flows through the diode when it is reverse biased $-V_D$ is negative), q is the electronic charge ($1.602 \times 10^{-19}$C), k is Boltzmann's constant ($1.38 \times 10^{-23}$J/° K), T=junction temperature in Kelvins, and n is the emission coefficient.

Zener diodes are designed to pass a current in the reverse direction when the voltage across it reaches a certain (negative) value, called the Zener voltage ($V_Z$). For diode voltages $V_D > -V_Z$, the Zener diode behaves like a normal diode. However, when $V_D = -V_Z$, the diode allows current to flow in the breakdown condition and keeps the voltage $V_D$ nearly constant at the value $-V_Z$. In this way, the Zener diode can act as a voltage regulator.

Figure 3:
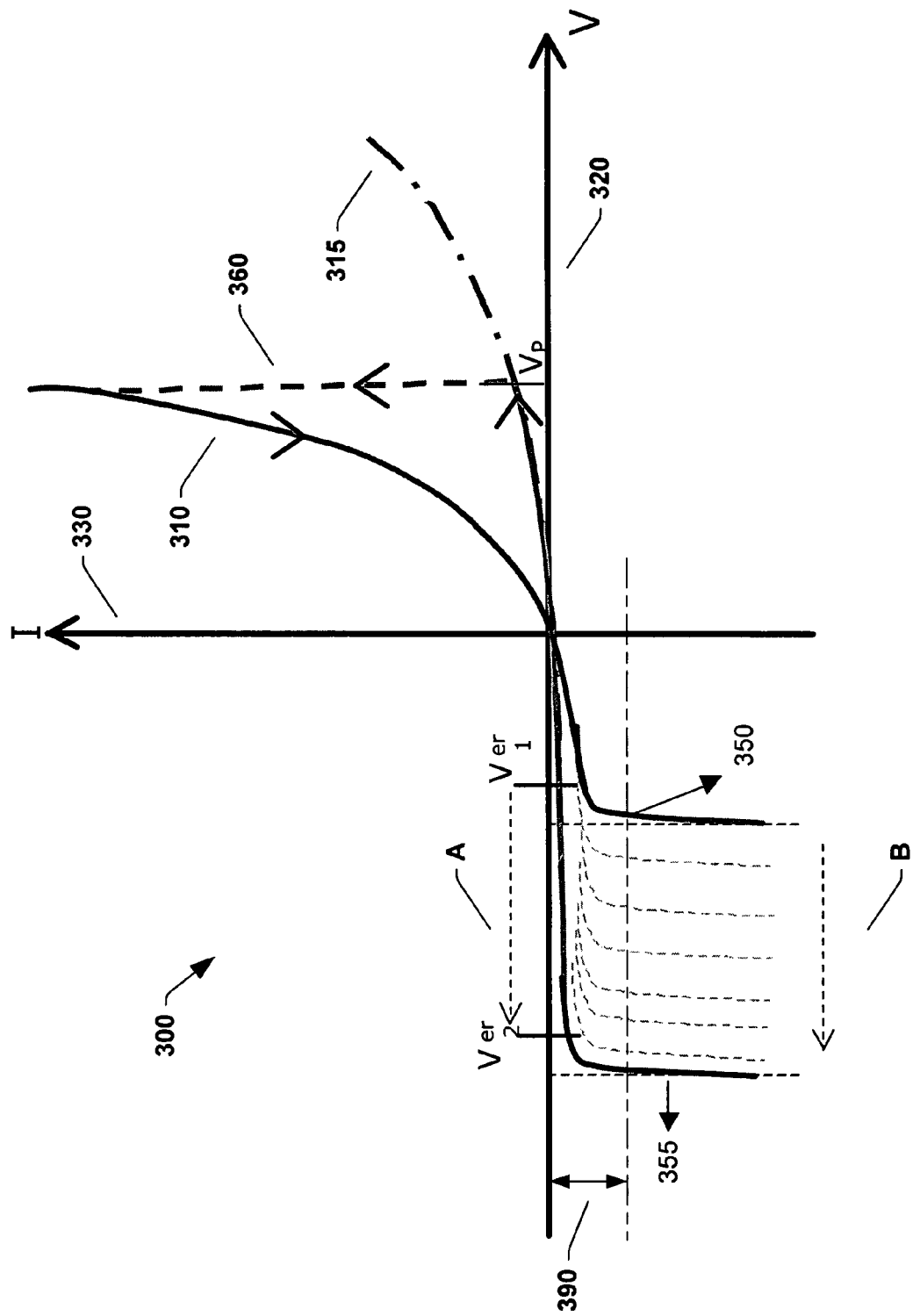
FIG. 3 is a graph 300 illustrating current (I) vs. voltage (V) plot of characteristics for a memory device in accordance with an aspect of the invention.

Referring now to FIG. 3, illustrated is a graph 300 of a current (I) vs. voltage (V) relationship of a memory cell according to an aspect of the invention. The current-voltage relationship is depicted as lines 310 and 315. The graph 300 displays a horizontal axis 320 representing voltage (V) and a vertical axis 330 representing current (I). The portion of the horizontal axis 320 to the right of the vertical axis 330 represents positive voltage and the portion of the horizontal axis 320 to the left of the vertical axis 330 represents negative voltage. Similarly, the portion of the vertical axis 330 above the horizontal axis 320 represents positive current and the portion of the vertical axis 330 below the horizontal axis 320 represents negative current.

FIG. 3 shows two memory states represented by the current-voltage plot. Line 310 corresponds to the "ON" state (referred to as "1") of the memory cell and line 315 corresponds to the "OFF" state (referred to as "0") of the memory cell. Each state, "OFF" and "ON", has a corresponding reverse-breakdown voltage, $V_{BR}$. The breakdown voltage of the "ON" state ($V_{BRon}$) is shown as the portion of line 310 at 350. The breakdown voltage of the "OFF" state ($V_{BRoff}$) is shown as the portion of line 315 at 355.

According to one aspect of the invention, with a P+ passive layer, positively charged dopant ions, such as Cu+, Li+, Na+, etc., and an n-active layer, the $V_{BR}$ is dependent on the doping level or doping degree ($N_D$) of the active layer. Thus, the reverse-breakdown relationship can be expressed as:

$$V_{BR} \approx 1/N_D$$

where $V_{BR}$ is the breakdown voltage and $N_D$ is the doping degree. The value or degree of $N_D$ is reversibly changed by the doping and the de-doping of the active layer, with the dopant ions. The passive layer is the supplier of the dopant ions and is generally strongly P+. The passive layer's P+ nature is unaffected by the movement of dopant ions from it to the active layer.

To program the memory cell, an external stimuli, such as a program voltage, $V_P$, is applied in a positive direction (as shown by line 360). This causes the ions to move into the active layer, thereby causing doping of the active layer. The doping of the active layer causes the reverse-breakdown voltage to be changed from $V_{BRoff}$ 355 to $V_{BRon}$ 350. To read this programmed state, a bias in the negative direction, slightly above $V_{BRon}$ 350 is applied. According to an aspect of the invention, the breakdown can be either avalanche breakdown or tunneling breakdown.

To erase the memory, an external stimuli is applied in the negative direction to move ions from the active layer into the passive layer. This movement of ions out of the active layer is referred to as de-doping. If the applied stimuli or bias is higher than $V_{BRon}$ 350, it would result in breakdown current to flow and thus impede ion-motion, thus the applied stimuli, to result in an erase state, must not be higher than $V_{BRon}$ 350. As de-doping occurs, the reverse-breakdown voltage moves towards $V_{Broff}$ 355, and the erase voltage $V_{er}$ can follow as a traveling voltage, shown in the direction of Arrows A and B. The traveling erase voltage $V_{er}$ will move from $V_{er1}$ toward $V_{er2}$, Arrow A, providing a relatively fast erase as opposed to simply applying a low initial erase voltage and waiting for complete erasure. As $V_{BR}$ moves from $V_{BRon}$ to $V_{BRoff}$, as shown by Arrow B, the active layer is de-doped, resulting in erasure of the memory cell.

The memory cell has different branches of current-voltage exhibiting characteristics of a Zener diode, for example, with a variable doping degree. Exemplary depiction of the different branches are shown as the dotted lines between voltage break down lines 350 and 355.

Additionally, the read current limit or range, shown by line 390, is from about a zero current level to a negative current level. When used as a memory element, a current limited read signal may be used instead of a voltage limited read signal.

Figure 4:
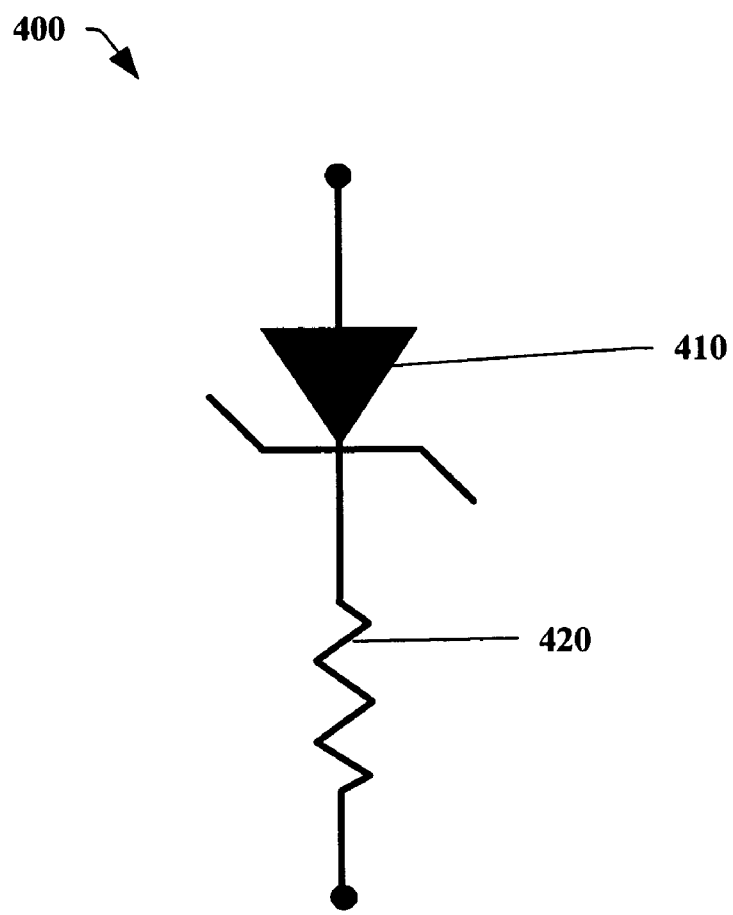
FIG. 4 is a diagram illustrating a Zener-type diodic device in accordance with an aspect of the invention.

Turning now to FIG. 4, a diagram illustrating a Zener-type diodic semiconductor device 400 in accordance with an aspect of the invention is shown. The semiconductor device 400 is modeled as a Zener diode 410 and a resistor 420. The Zener diode 410 is representative of the diodic layer of the invention. The resistor 420 is representative of a memory cell. The Zener diode 410 operates as a normal diode unless a specific predetermined reverse bias voltage is applied to cause a breakdown. Thus, during normal operation current will flow through the resistor (memory cell) 420. This allows the application of various voltages to program and read various states of the memory cell 420. For instance, erasure of the memory cell 420 can be accomplished by utilizing the unique nature of a Zener diode to breakdown when a predetermined reverse bias voltage is applied. This is discussed infra.

Figure 5:
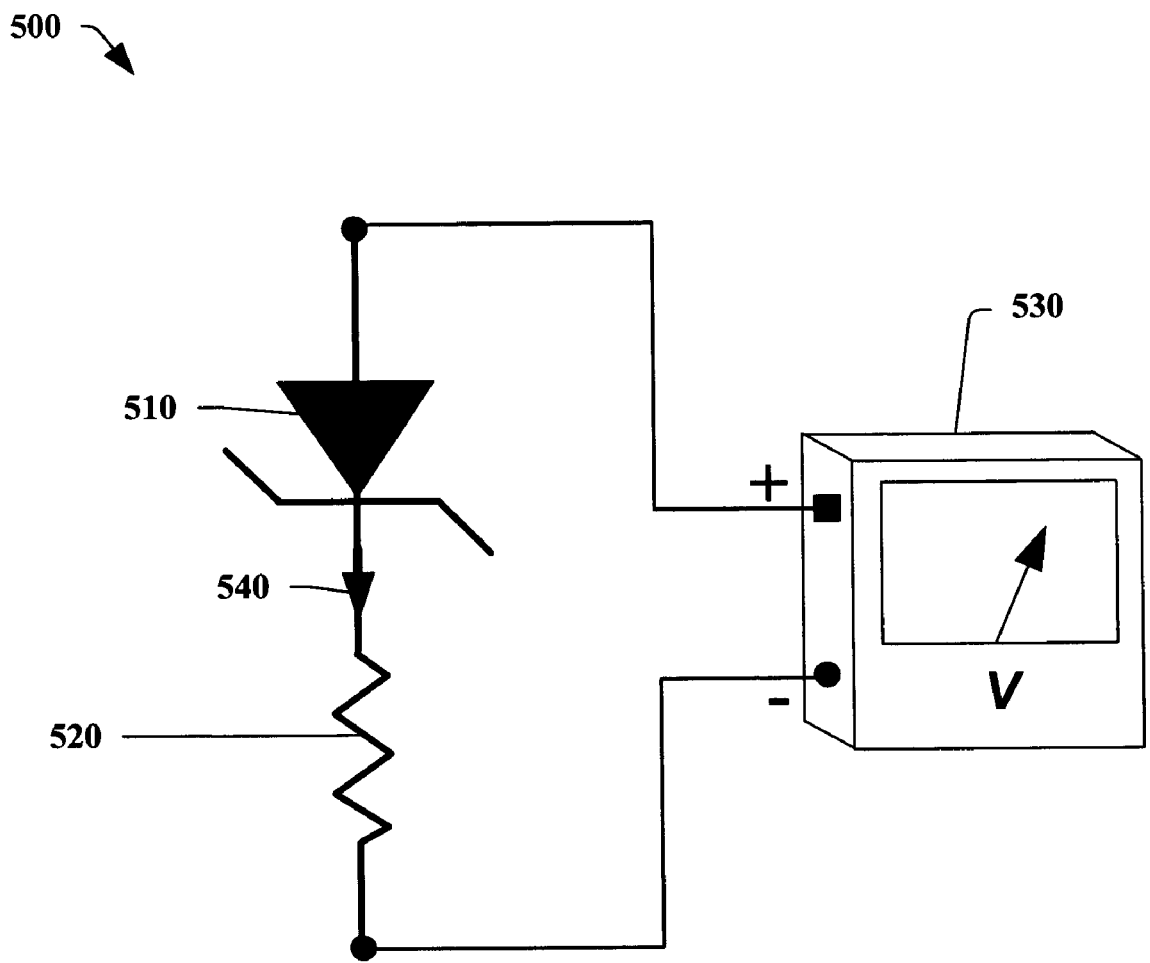
FIG. 5 is a diagram illustrating a Zener-type diodic device with an applied forward bias voltage in accordance with an aspect of the invention.

Referring to FIG. 5, illustrated is a Zener-type diodic semiconductor device 500 with an applied forward bias voltage in accordance with an aspect of the invention. The semiconductor device 500 has a forward voltage applied across the device 500 by a voltage source 530. The forward voltage is greater than the switch-on voltage level of a Zener-type diodic layer 510. Thus, current 540 is allowed to flow through the memory cell 520. The actual current value is dependent upon the value of the applied voltage from the voltage source 530. In this manner, the memory cell 520 can be programmed and/or read.

Figure 6:
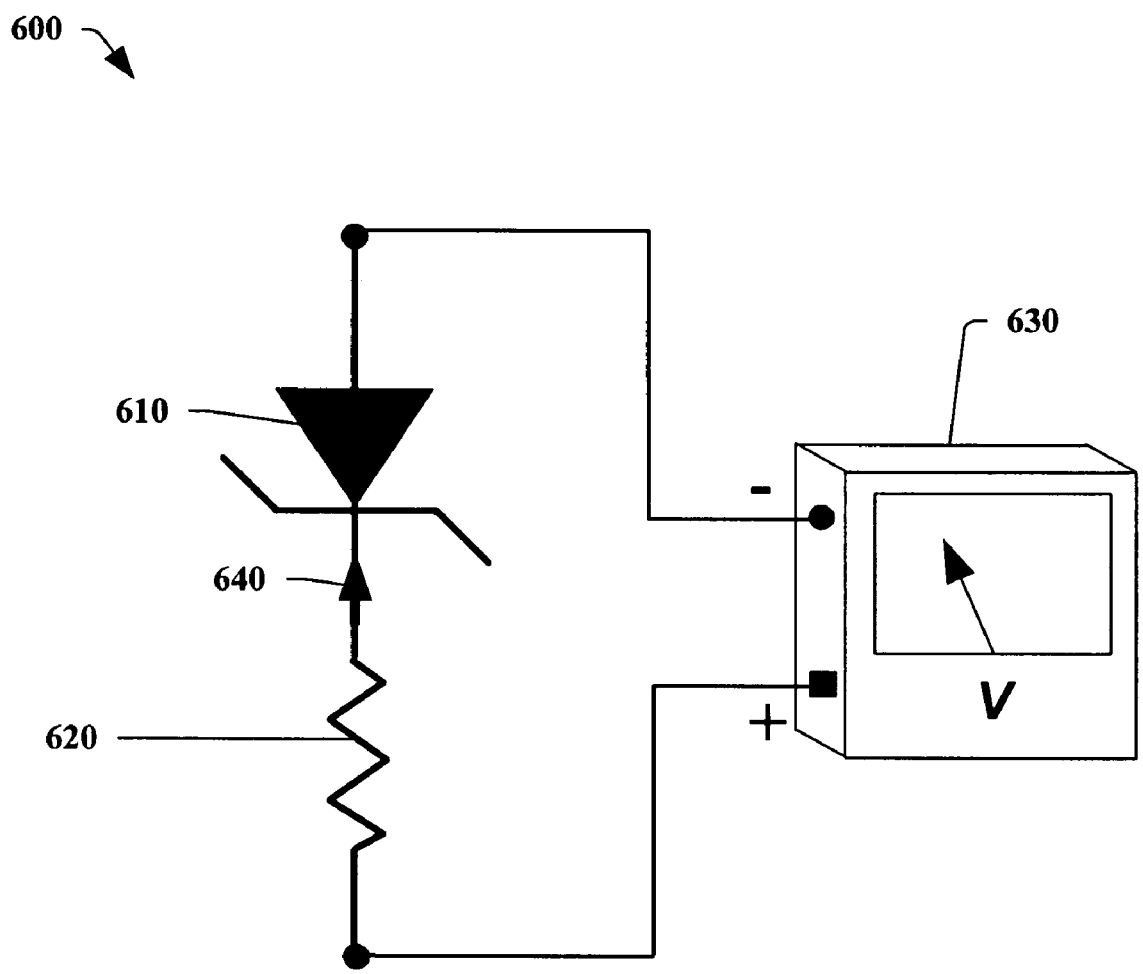
FIG. 6 is a diagram illustrating a Zener-type diodic device with an applied reverse bias voltage in accordance with an aspect of the invention.

FIG. 6 illustrates a Zener-type diodic semiconductor device 600 with an applied reverse bias voltage in accordance with an aspect of the invention. The semiconductor device 600 has a reverse bias voltage applied across it by a voltage source 630. The voltage level is less than the breakdown voltage level of the Zener-type diodic layer represented as a Zener diode 610. The leakage current of the Zener diode 610 is very small and, thus, the current flow 640 through the memory cell 620 is also small. Because the Zener diode cannot flow a significant amount of current until a certain reverse bias voltage threshold is reached (breakdown voltage), it prevents inadvertent low level reverse bias voltages from erasing the memory cell 620. Thus, it is desirable to dope the polymer to a sufficient degree so the diodic layer media posses low leakage current characteristics.

Figure 7:
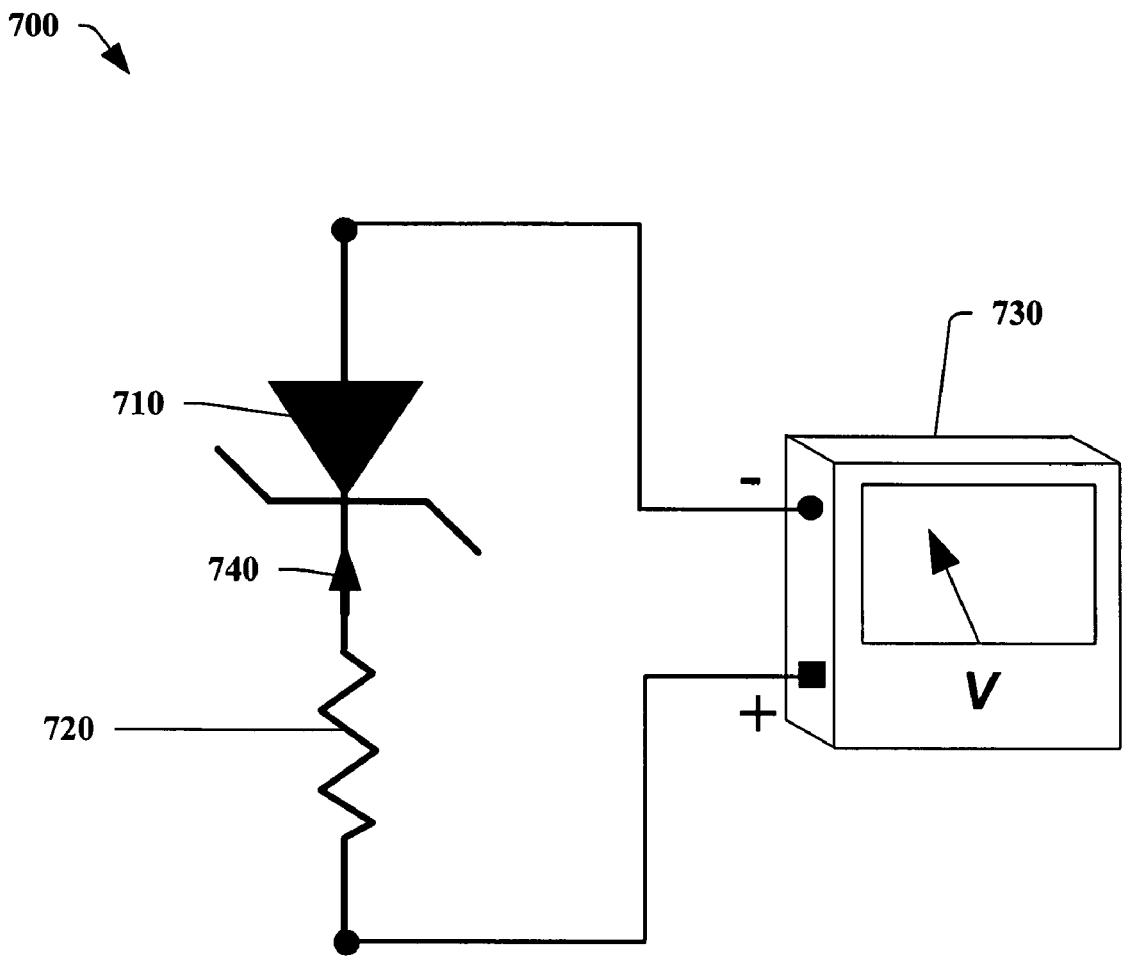
FIG. 7 is a diagram illustrating a Zener-type diodic device with an applied reverse bias voltage greater than the Zener breakdown voltage in accordance with an aspect of the invention.

With reference now to FIG. 7, a diagram illustrating a Zener-type diodic semiconductor device 700 with an applied reverse bias voltage greater than the Zener breakdown voltage in accordance with an aspect of the invention is shown. The semiconductor device 700 has a reverse bias voltage greater than the Zener breakdown voltage applied across it by a voltage source 730. The semiconductor cell 720 working in conjunction with the diodic layer 710 will have some potential drop across it. Thus, the voltage across the semiconductor device 700 will generally need to be greater than the breakdown voltage associated with the diodic layer 710 to account for the potential drop of the semiconductor cell 720. Likewise, if the semiconductor cell 720 requires a certain voltage level to perform its operation, the voltage drop across the Zener diode must be taken into account also. When breakdown occurs, a current flow 740 through the memory cell 720 is maximized. This current flow 740 is sufficient to provide an operational function, such as erasing and/or programming the memory cell 720.

Figure 8:
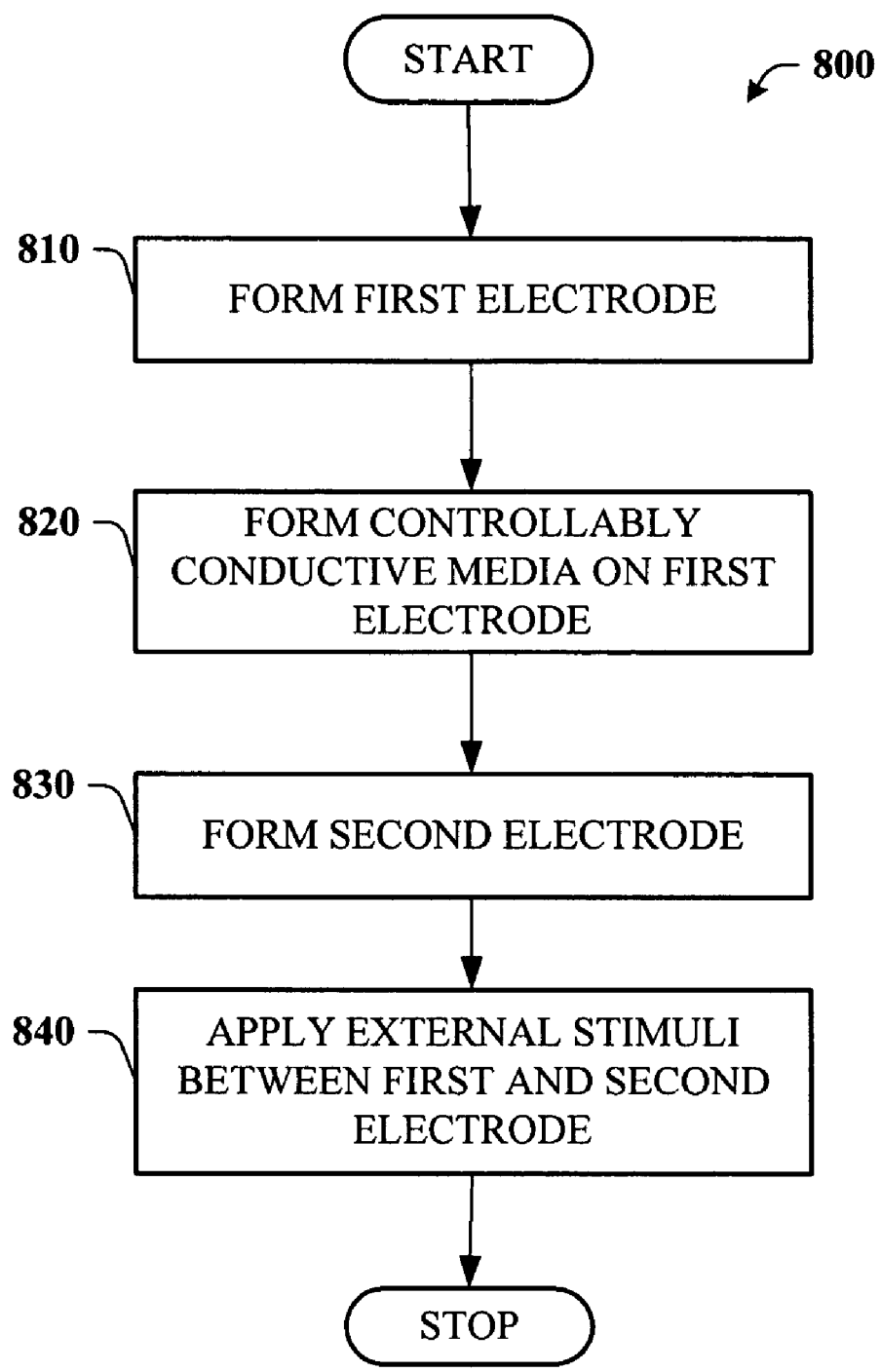
FIG. 8 is a flow diagram illustrating a methodology of fabricating a diodic device in accordance with an aspect of the invention.

In view of the exemplary systems shown and described above, methodologies, which may be implemented in accordance with one or more aspects of the invention will be better appreciated with reference to the flow diagram of FIG. 8. While, for purposes of simplicity of explanation, the methodology is shown and described as a series of function blocks, it is to be understood and appreciated that the present invention is not limited by the order of the blocks, as some blocks may, in accordance with the invention, occur in different orders and/or concurrently with other blocks from that shown and described herein.

Moreover, not all illustrated blocks may be required to implement a methodology in accordance with one or more aspects of the present invention. It is to be appreciated that the various blocks may be implemented via software, hardware a combination thereof or any other suitable means (e.g. device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

Continuing with FIG. 8, a flow diagram of a methodology 800 of fabricating a memory cell in accordance with an aspect of the invention is illustrated. A first electrode is formed on a substrate at 810. The first electrode includes a conductive material such as aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal suicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the first electrode can vary depending on the implementation and the memory device being constructed. Typically, the thickness of each electrode is independently about 0.01 µm or more and about 10 µm or less.

After forming the first electrode, a layer of controllably conductive media is formed on the first electrode at 820. The controllably conductive media contains one or more low conductive layers and one or more passive layers. The low conductive layer can be formed from various materials including organic semiconductor materials, inorganic semiconductor materials and mixtures of organic and inorganic semiconductor materials. Typically, the low conductive or active layer has a thickness of about 0.001 µm or more and about 5 µm or less.

The passive layer contains at least one conductivity facilitating compound that contributes to the controllably conductive properties of the controllably conductive media. The conductivity facilitating compound has the ability to donate and accept charges (holes and/or electrons). The passive layer thus may transport between an electrode and the low conductive layer/passive layer interface, facilitate charge/carrier injection into the low conductive layer, and/or increase the concentration of a charge carrier in the low conductive layer. Typically, the passive layer containing the conductivity facilitating compound has a thickness of 2 Å or more and about 0.1 µm or less.

A second electrode is then formed over the controllably conductive media layer at 830. To program the memory cell, an external stimuli is applied between the first electrode and the second electrode at 840. The external stimuli may be an external electric field, radiation, and the like. An external stimuli applied in a first or positive direction causes ions to move from the passive layer into the active layer, doping the active layer and changing the reverse breakdown voltage of the active layer from a first breakdown voltage to a second breakdown voltage. This change in the electrical characteristics and the voltage breakdown allows programming of the memory cell.

At 850, the memory cell is read by applying a second external stimuli in a reverse or negative direction. The magnitude of the external stimuli, is applied in a negative direction slightly above the programming voltage breakdown level of the active layer.

At 860, the memory cell is erased by applying a bias or external stimuli in a negative direction to move ions from the active layer back into the passive layer, or de-doping the active layer. As de-doping occurs, the reverse breakdown voltage moves from a second breakdown voltage to a first breakdown voltage allowing the erase voltage of the memory cell to follow as a traveling voltage. This allows a relatively fast erase instead of simply applying low initial erase voltage and waiting for complete erasure.

Figure 9:
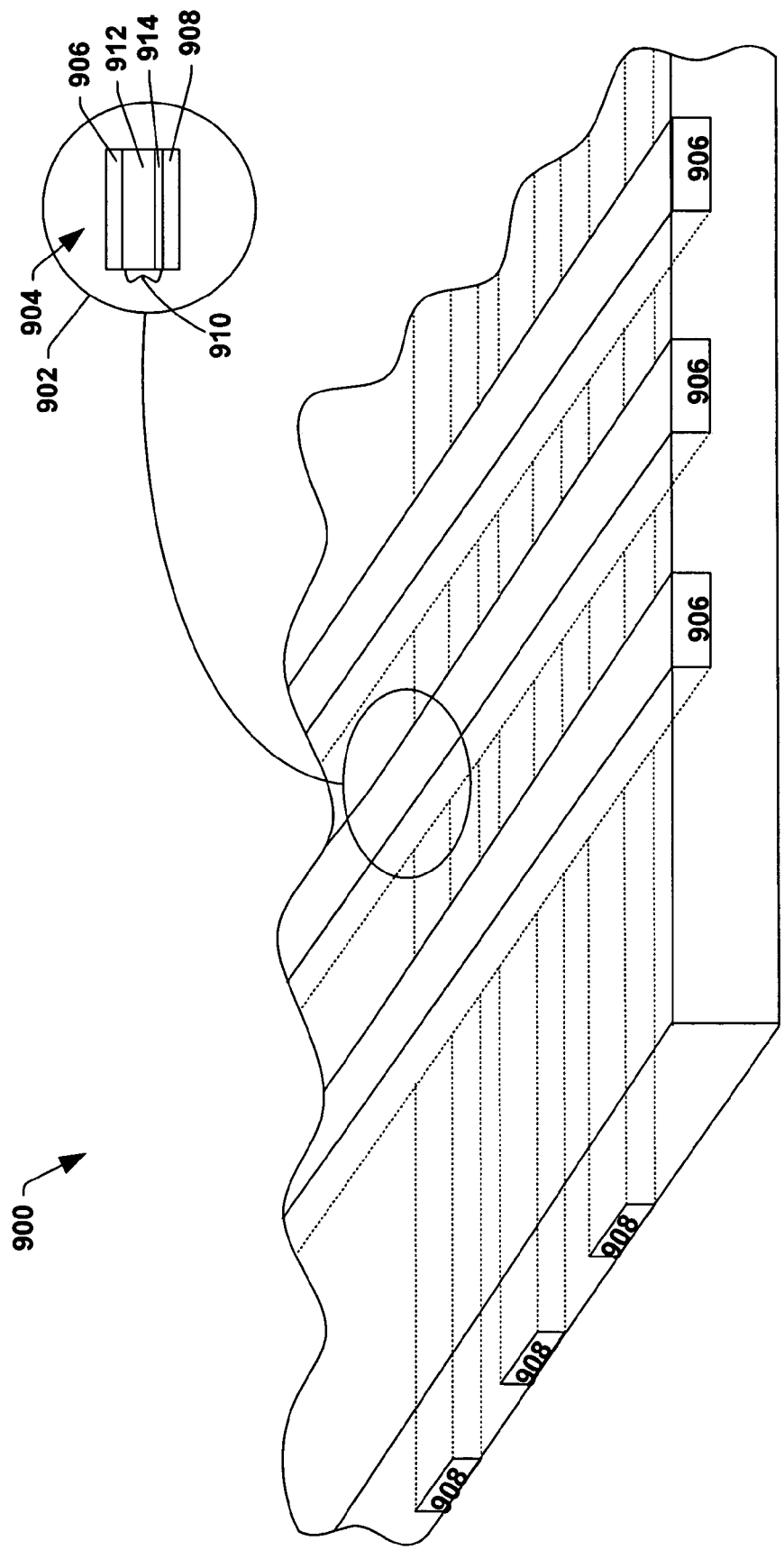
FIG. 9 illustrates a perspective view of a two dimensional microelectronic device containing a plurality of memory cells in accordance with one aspect of the invention.

Referring now to FIG. 9, a brief description of an exemplary microelectronic memory device 900 containing a plurality of memory cells that can be utilized in accordance with an aspect of the invention is shown, as well as an exploded view 902 of an exemplary memory cell 904. The microelectronic memory device 900, for example, contains a desired number of memory cells, as determined by the number of rows, columns, and layers (three dimensional orientation described later) present. The first electrodes 906 and the second electrodes 908 are shown in substantially perpendicular orientation, although other orientations are possible to achieve the structure of the exploded view 902. Each memory cell 904 contains a first electrode 906 and a second electrode 908 with a controllably conductive media 910 therebetween. The controllably conductive media 910 contains a low conductive layer 912 and passive layer 914. Peripheral circuitry and devices are not shown for brevity.

The memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like.

Examples of electrodes include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

The controllably conductive media, disposed between the two electrodes, can be rendered conductive, semiconductive, or nonconductive in a controllable manner using an external stimuli. Generally, in the absence of an external stimuli, the controllably conductive media is nonconductive or has a high impedance. Further, in some embodiments, multiple degrees of conductivity/resistivity may be established for the controllably conductive media in a controllable manner. For example, the multiple degrees of conductivity/resistivity for the controllably conductive media may include a nonconductive state, a highly conductive state, and a semiconductive state.

The memory devices described herein can be employed to form logic devices such as central processing units (CPUs); volatile memory devices such as DRAM devices, SRAM devices, and the like; input/output devices (I/O chips); and non-volatile memory devices such as EEPROMs, EPROMs, PROMs, and the like. The memory devices may be fabricated in planar orientation (two dimensional) or three dimensional orientation containing at least two planar arrays of the memory cells.

Figure 10:
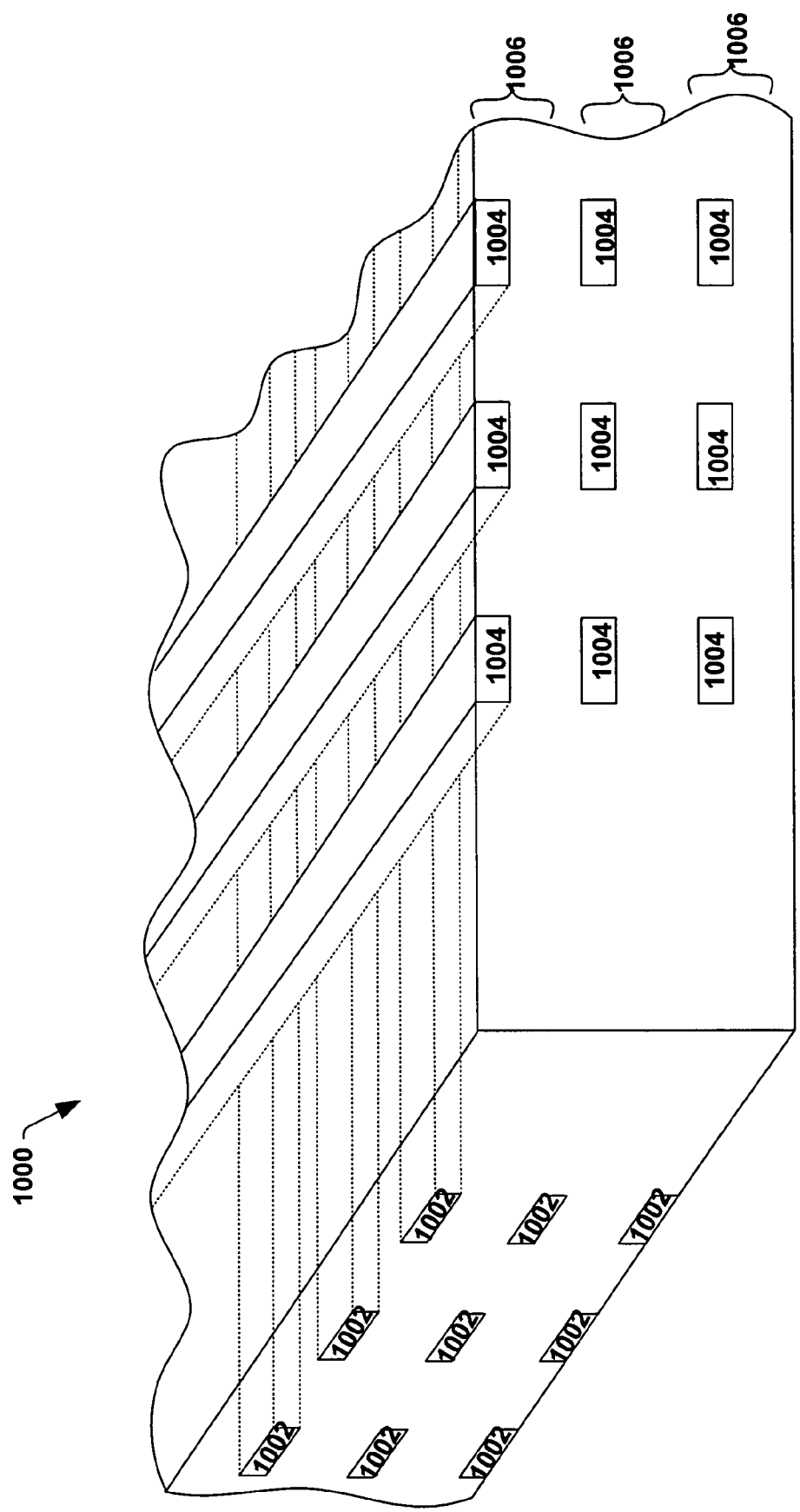
FIG. 10 illustrates a perspective view of a three dimensional microelectronic device containing a plurality of memory cells in accordance with another aspect of the invention.

Referring to FIG. 10, an exemplary three dimensional microelectronic memory device 1000 containing a plurality of memory cells that can be utilized in accordance with an aspect of the invention is shown. The three dimensional microelectronic memory device 1000 contains a plurality of first electrodes 1002, a plurality of second electrodes 1004, and a plurality of memory cell layers 1006. Between the respective first and second electrodes are the controllably conductive media (not shown). The plurality of first electrodes 1002 and the plurality of second electrodes 1004 are shown in substantially perpendicular orientation, although other orientations are possible. The three dimensional microelectronic memory device is capable of containing an extremely high number of memory cells thereby improving device density. Peripheral circuitry and devices are not shown for brevity.

The memory cells/devices are useful in any device requiring memory. For example, the memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the memory devices. Examples of hand-held devices include cell phones and other two way communication devices, personal data assistants, palm pilots, pagers, notebook computers, remote controls, recorders (video and audio), radios, small televisions and web viewers, cameras, and the like.

Figure 11:
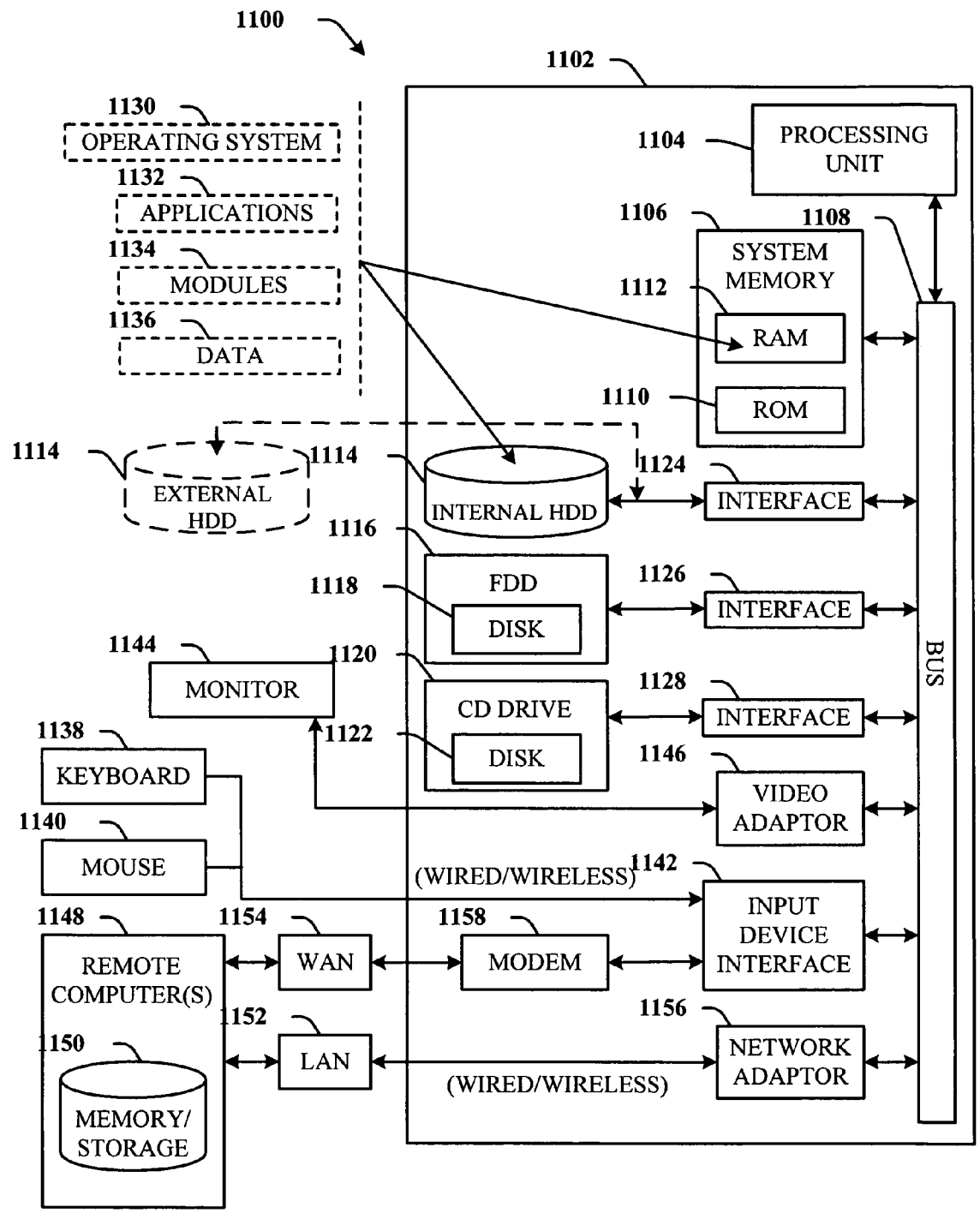
FIG. 11 illustrates a block diagram of a computer operable to execute the disclosed invention.

Referring now to FIG. 11, an exemplary system environment 1100 for implementing the various aspects of the invention is illustrated. Generally, program modules include routines, programs, components, data structures, etc., that perform particular tasks or implement particular abstract data types. Moreover, those skilled in the art will appreciate that the inventive methods may be practiced with other computer system configurations, including single-processor or multi-processor computer systems, minicomputers, mainframe computers, as well as personal computers, hand-held computing devices, microprocessor-based or programmable consumer electronics, and the like, each of which may be operatively coupled to one or more associated devices.

The illustrated aspects of the invention may also be practiced in distributed computing environments where certain tasks are performed by remote processing devices that are linked through a communications network. In a distributed computing environment, program modules may be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer readable media can comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

With reference again to FIG. 11, there is illustrated an exemplary environment 1100 for implementing various aspects of the invention that includes a computer 1102, the computer 1102 including a processing unit 1104, a system memory 1106 and a system bus 1108. The system bus 1108 couples system components including, but not limited to, the system memory 1106 to the processing unit 1104. The processing unit 1104 may be any of various commercially available processors. Dual microprocessors and other multi-processor architectures may also be employed as the processing unit 1104.

The system bus 1108 can be any of several types of bus structure that may further interconnect to a memory bus (with or without a memory controller), a peripheral bus, and a local bus using any of a variety of commercially available bus architectures. The system memory 1106 includes read only memory (ROM) 1110 and random access memory (RAM) 1112. A basic input/output system (BIOS) is stored in a non-volatile memory 1110 such as ROM, EPROM, EEPROM, which BIOS contains the basic routines that help to transfer information between elements within the computer 1102, such as during start-up. The RAM 1112 can also include a high-speed RAM such as static RAM for caching data.

The computer 1102 further includes an internal hard disk drive (HDD) 1114 (e.g., EIDE, SATA), which internal hard disk drive 1114 may also be configured for external use in a suitable chassis (not shown), a magnetic floppy disk drive (FDD) 1116, (e.g., to read from or write to a removable diskette 1118) and an optical disk drive 1120, (e.g., reading a CD-ROM disk 1122 or, to read from or write to other high capacity optical media such as the DVD). The hard disk drive 1114, magnetic disk drive 1116 and optical disk drive 1120 can be connected to the system bus 1108 by a hard disk drive interface 1124, a magnetic disk drive interface 1126 and an optical drive interface 1128, respectively. The interface 1124 for external drive implementations includes at least one or both of Universal Serial Bus (USB) and IEEE 1394 interface technologies.

The drives and their associated computer-readable media provide nonvolatile storage of data, data structures, computer-executable instructions, and so forth. For the computer 1102, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the invention.

A number of program modules can be stored in the drives and RAM 1112, including an operating system 1130, one or more application programs 1132, other program modules 1134 and program data 1136. All or portions of the operating system, applications, modules, and/or data can also be cached in the RAM 1112.

It is appreciated that the invention can be implemented with various commercially available operating systems or combinations of operating systems.

A user can enter commands and information into the computer 1102 through one or more wired/wireless input devices, e.g., a keyboard 1138 and a pointing device, such as a mouse 1140. Other input devices (not shown) may include a microphone, an IR remote control, a joystick, a game pad, a stylus pen, touch screen, or the like. These and other input devices are often connected to the processing unit 1104 through an input device interface 1142 that is coupled to the system bus 1108, but may be connected by other interfaces, such as a parallel port, an IEEE 1394 serial port, a game port, a USB port, an IR interface, etc.

A monitor 1144 or other type of display device is also connected to the system bus 1108 via an interface, such as a video adapter 1146. In addition to the monitor 1144, a computer typically includes other peripheral output devices (not shown), such as speakers, printers etc.

The computer 1102 may operate in a networked environment using logical connections via wired and/or wireless communications to one or more remote computers, such as a remote computer(s) 1148. The remote computer(s) 1148 may be a workstation, a server computer, a router, a personal computer, portable computer, microprocessor-based entertainment appliance, a peer device or other common network node, and typically includes many or all of the elements described relative to the computer 1102, although, for purposes of brevity, only a memory storage device 1150 is illustrated. The logical connections depicted include wired/wireless connectivity to a local area network (LAN) 1152 and/or larger networks, e.g., a wide area network (WAN) 1154. Such LAN and WAN networking environments are commonplace in offices, and companies, and facilitate enterprise-wide computer networks, such as intranets, all of which may connect to a global communication network, e.g., the Internet.

When used in a LAN networking environment, the computer 1102 is connected to the local network 1152 through a wired and/or wireless communication network interface or adapter 1156. The adaptor 1156 may facilitate wired or wireless communication to the LAN 1152, which may also include a wireless access point disposed thereon for communicating with the wireless adaptor 1156. When used in a WAN networking environment, the computer 1102 can include a modem 1158, or is connected to a communications server on the LAN, or has other means for establishing communications over the WAN 1154, such as by way of the Internet. The modem 1158, which may be internal or external and a wired or wireless device, is connected to the system bus 1108 via the serial port interface 1142. In a networked environment, program modules depicted relative to the computer 1102, or portions thereof, may be stored in the remote memory/storage device 1150. It will be appreciated that the network connections shown are exemplary and other means of establishing a communications link between the computers may be used.

The computer 1102 is operable to communicate with any wireless devices or entities operably disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™0 wireless technologies. Thus, the communication may be a predefined structure as with conventional network or simply an ad hoc communication between at least two devices.

Wi-Fi, or Wireless Fidelity, allows connection to the Internet from a couch at home, a bed in a hotel room or a conference room at work, without wires. Wi-Fi is a wireless technology like a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, with an 11 Mbps (802.11b) or 54 Mbps (802.11a) data rate or with products that contain both bands (dual band), so the networks can provide real-world performance similar to the basic 10BaseT wired Ethernet networks used in many offices.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of controlling a memory cell comprising:
   providing a controllably conductive media between a first electrode and at least a second electrode, the controllably conductive media comprising at least one active layer having a breakdown voltage and at least one passive layer comprising super ionic material;
   doping the active layer; and
   altering a state of the memory cell by changing the breakdown voltage of the at least one active layer from a first value to a second value, each value is associated with a different state of the memory cell.

2. The method of claim 1, wherein doping the active layer further comprises:
   applying an external stimuli having a first polarity;
   causing dopant to move from the passive layer to the active layer;
   reducing the breakdown voltage of the active layer;
   placing the memory cell in a program state.

3. The method of claim 2, further comprising:
   applying an external stimuli having a second polarity and a magnitude slightly larger than the reduced breakdown voltage; and
   placing the memory cell in a read state.

4. The method of claim 2, further comprising:
   applying an external stimuli having a second polarity;
   de-doping the active layer; and
   placing the memory cell in an erase state.

5. The method of claim 4, wherein de-doping the active layer comprises causing the dopant to move from the active layer to the passive layer.

6. The method of claim 1, the breakdown voltage is determined by the doping level of the active layer.

7. The method of claim 6, the doping level determines the electrical characteristics of the memory cell.

8. The method of claim 1, wherein the super ionic material is selected from the group consisting of $Cu_2S$, $CuS$, $Ag_2S$, $CuO$, $Cu_2O$, $Cu_2Se$, $Ag_2Se$ and $TiSe_2$.

9. The method of claim 1, the active layer has operating characteristics of a Zener diode.

10. The method of claim 1, wherein the active layer comprises one of an organic semiconductor material, an inorganic semiconductor material and a mixture of organic and inorganic semiconductor material.

11. The method of claim 1, wherein the passive layer comprises at least one conductivity facilitating compound.

12. A method of controlling a memory cell, comprising:
    providing a first electrode and at least a second electrode;
    placing a controllably conductive media between the first electrode and the at least a second electrode, the controllably conductive media comprises a super ionic layer and an active layer having a first breakdown voltage level and at least a second breakdown voltage level, and
    selectively modifying a value of an applied external stimuli between the first breakdown voltage level and at least the second breakdown voltage level to change the electrical characteristics of the memory cell, wherein each breakdown voltage level corresponds to a different state of the memory cell.

13. The method of claim 12, modifying the value of the external stimuli from the first breakdown voltage level to the at least a second breakdown voltage level erases the memory cell.

14. The method of claim 12, modifying the value of the external stimuli from the at least a second breakdown voltage level to a value slightly above the first breakdown voltage level programs the memory cell.

15. The method of claim 12, further comprising selecting a material of the active layer from at least one of an organic semiconductor material, an inorganic semiconductor material or a mixture of organic and inorganic semiconductor material.

16. The method of claim 12, further comprising selecting a material of the superior ionic material from the group consisting of $Cu_2S$, $CuS$, $Ag_2S$, $CuO$, $Cu_2O$, $Cu_2Se$, $Ag_2Se$ and $TiSe_2$.

17. The method of claim 12, selectively modifying the value of the external stimuli from the first breakdown voltage level to the at least a second breakdown voltage level causes a traveling erase voltage to provide a relatively fast erase of the memory cell.

18. The method of claim 12, further comprising selectively changing the controllably conductive media to at least one of conductive, semiconductive, or nonconductive in a controllable manner with the applied external stimuli.

19. The method of claim 12, applying the external stimuli in a first direction causes doping of the active layer, placing the memory cell in a programming state.

20. The method of claim 19, applying the external stimuli in a second direction causes de-doping of the active layer, placing the memory cell in an erase state.

21. A computer that employs the method of claim 12.

22. A hand-held electronic device that employs the method of claim 12.

23. A memory device comprising an array of the memory cells that employ the method of claim 12.

* * * * *